United States Patent [19]
Tanaka et al.

[11] Patent Number: 5,260,518
[45] Date of Patent: Nov. 9, 1993

[54] MULTILAYER CIRCUIT BOARD FOR MOUNTING ICS AND METHOD OF MANUFACTURING THE SAME

[75] Inventors: Yasuyuki Tanaka, Tsuchiura; Chikafumi Oomachi, Kashiwa, both of Japan

[73] Assignee: Nippon Mektron, Ltd., Tokyo, Japan

[21] Appl. No.: 778,178

[22] PCT Filed: Apr. 19, 1991

[86] PCT No.: PCT/JP91/00523
§ 371 Date: Dec. 13, 1991
§ 102(e) Date: Dec. 13, 1991

[87] PCT Pub. No.: WO91/16726
PCT Pub. Date: Oct. 31, 1991

[30] Foreign Application Priority Data
Apr. 23, 1990 [JP] Japan ................ 2-107114

[51] Int. Cl.⁵ ................ H05K 1/00
[52] U.S. Cl. ................ 174/261; 174/255; 174/263; 361/760
[58] Field of Search ................ 174/255, 259, 260, 261, 174/262, 263, 264, 265; 361/400; 428/901; 427/96, 97; 228/180.1, 180.2

[56] References Cited
U.S. PATENT DOCUMENTS

| | | | |
|---|---|---|---|
| 3,319,317 | 5/1967 | Roche et al. | 174/261 X |
| 3,458,925 | 8/1969 | Napier et al. | 228/180.2 X |
| 4,273,859 | 6/1981 | Mones et al. | 228/180.2 X |
| 4,420,364 | 12/1983 | Nukii et al. | 174/260 X |
| 4,528,064 | 7/1985 | Ohsawa et al. | 427/97 X |
| 4,617,730 | 10/1986 | Geldermans et al. | 427/97 X |
| 4,737,395 | 4/1988 | Mabuchi et al. | 428/901 X |
| 4,871,608 | 10/1989 | Kondo et al. | 428/901 X |
| 5,019,551 | 5/1991 | Hidaka | 428/901 X |

Primary Examiner—Leo P. Picard
Assistant Examiner—Trinidad Korka
Attorney, Agent, or Firm—Chilton, Alix & Van Kirk

[57] ABSTRACT

A multilayer printed circuit board on which integrated circuit chips may be directly mounted has holes at predetermined locations, electrical connections between a chip and conductive layers of the circuit board being accomplished via the holes. The electrical connections are in the form of bump members which protrude outwardly from the circuit board. The bump members cooperate with an electrically conductive plating layer or filler that is in intimate contact with a conductive layer(s) exposed in the formation of each hole.

16 Claims, 6 Drawing Sheets

MULTILAYER CIRCUIT BOARD FOR MOUNTING ICS AND METHOD OF MANUFACTURING THE SAME

TECHNICAL FIELD

The present invention relates to a multilayer circuit board for mounting ICs on which IC bare chips can be directly mounted and which comprises a flexible circuit board, and to a method of manufacturing the same. More specifically, the invention relates to a multilayer circuit board for mounting ICs in which holes are formed in required positions, an electrically conductive bump members are formed to protrude from the circuit board in cooperation with a means for plating the walls of the holes or a means for filling the holes with a conductive material, and reliable electrical connection between a desired electrically conductive layer of the circuit board and pads of the IC bare chip is accomplished with the electrically conductive bump members, and to a preferred method of manufacturing the same.

BACKGROUND ART

A TAB system using a lead finger projectingly formed has been widely known as a method of mounting IC bare chips on a flexible circuit board. This system is chiefly employed for mounting ICs on a circuit board of a single layer. In the case of a mounting system using a multilayer flexible circuit board, as shown in FIG. 12, a flexible multilayer circuit board 1 for the flip-chip system is fabricated by laminating inner and outer electrically conductive layers 2 to 7 for forming required circuit wiring patterns via suitable insulating base members, and an IC bare chip 9 is connected to connection ends 2A and 3A of the outer conductive layers 2 and 3 via bumps 9A and 9B. In the case of FIG. 12, the outer conductive layer 2 is not electrically connected to the inner conductive layer 4, but is connected to the outer conductive layer 6 via a through-hole conductive portion 8. Further, the outer conductive layer 3 is electrically connected to the inner conductive layer 5 and the conductive layer 7 via a through-hole conductive portion 8A. The through-hole conductive portions 8 and 8A are formed suitably away from the bumps 9A and 9B for connection of the IC bare chip 9 and the connection terminals 2A and 3A. The connection ends 2A and 3A of the circuit board 1 and the connection bumps 9A and 3A for the IC bare chip 9 are connected together generally by soldering. Even in the case of the flexible multilayer circuit board 1 of the flip-chip structure, therefore, solder-flow blocking dams 10 and 10A are arranged around the connection ends 2A and 3A.

In the structure of the flexible multilayer circuit board 1 made under the above-mentioned flip-chip system, it is difficult to arrange the through-hole conductive portions 8 and 8A that connect the inner conductive layer to the outer conductive layers in the portion where the IC bare chip 9 is mounted due to the conduction structure using through-holes, and further, it is necessary to provide the solder-flow blocking dams 10 and 10A, putting great limitation on construction of the portion where the IC-bearing chip 9 is mounted on the circuit board 1. Therefore, circuit boards 1 of this type are usually bulky compared to the mounting density of the IC bare chips 9. Furthermore, the connection bumps 9A and 9B must be provided on the IC bare chip 9, requiring an increased number of steps. The increased steps and the provision of the solder-flow blocking dams inevitably raises the manufacturing costs on this IC mounting system.

To form through-hole conductive portions 8 and 8A by a conventional method, on the other hand, it is necessary to bore holes at required conductive portions using a drill, causing a problem of undesirable smear due to the frictional heat produced by the drilling using a drill that revolves at high speeds and a problem of an additional process of removing the smear. Furthermore, when the flexible circuit board of this type is of a soft material, the diameters of the holes is limited. In laminating the layers, moreover, it is not easy to regist the land positions and perforation positions of the required layer.

DISCLOSURE OF THE INVENTION

The present invention provides a multilayer circuit board for mounting ICs in which holes are formed at required portions in the circuit board to make electrical connection to desired electrically conductive layers of the multilayer circuit board, electrically conductive bump members are formed to protrude from the circuit board in cooperation with a means for plating the walls of the holes or a means for filling the holes with conductive material, and electrical connection is reliably accomplished by the electrically conductive bump members between desired electrically conductive layers of the circuit board and pads of the IC-bearing chip, enabling the IC bare chip to be easily and quickly mounted on the bump members formed on the multilayer circuit board by such means as heat-welding method, ultrasonic bonding, a laser beam or infrared rays, and further provides a method of manufacturing the multilayer circuit board for mounting ICs.

For this purpose, in the multilayer circuit board for mounting ICs of the present invention in which a plurality of conductive circuit layers forming required circuit wiring patterns are laminated via insulating base members, stepped holes are formed at required portions at which the conductive circuit layers are connected to each other in a manner that the ends of the conductive layers are exposed stepwisely, interlayer conductive members are provided in the stepped holes to electrically connect the above conductive layers to each other, and electrically conductive bump members for connection to IC pads are provided on the interlayer conductive members to protrude outside of the circuit board from the interlayer conductive material. In the above-mentioned multilayer circuit board for mounting ICs, the interlayer conductive members may be made of a plated material that is electrically connected to the conductive bump members, or may comprises bump seat made of interlayer conductive members. Alternatively, the interlayer conductive members and the conductive bump members may be made of the same electrically conductive material provided by such means as solder plating. When the electrically conductive bump members are formed of solder material, the protruded portion can be formed in a semi-spherical shape by reflow processing.

In the bump structure for connection to the IC-bearing chips, preferably, holes for conduction are bored preferably to a particular conductive circuit layer among the conductive circuit layers, conductive members are provided in the holes for conduction to the above particular conductive circuit layer, and conductive bump members are arranged on the conductive members to protrude outside of the circuit board from the conductive member so as to be electrically connected to the IC pads. Even in such a conductive bump structure, the same method as the one in which the above bump seats, or the same material for the conductive members and the conductive bump members are used can be applied.

The method of manufacturing such a multilayer circuit board for mounting ICs preferably comprises basic steps of forming required circuti wiring patterns on the inner conductive circuit layers except outer conductive circuit layers, boring holes for conduction in the inner and outer conductive circuit layers at portions where these conductive layers are to be connected to each other, the holes for conduction being bored by excimer laser means and having diameters that increase gradually, laminating the inner and outer conductive circuit layers one upon another via insulating base members and joining them together, boring stepped holes by removing the insulating base members from portions where the conductive layers are to be electrically connected to each other in a manner that the conductive layers are exposed stepwisely, patterning the outer conductive circuit layer to form a required circuit wiring after interlayer conductive members has been formed in the stepped holes, and forming electrically conductive bump members for connection to IC pads on the interlayer conductive members so as to outwardly protrude from the circuit board.

The steps after the step of forming the stepped hole can be modified as follows. Solder plating is applied to the stepped holes so that the conductive layers may be electrically connected to each other. The solder plated members are partly protruded from the circuit board to form electrically conductive bump members to be connected to the IC pads. Thereafter, the outer conductive circuit layer is patterned to form a required circuit wiring. Thus, the interlayer conductive members and the conductive bump members can be formed of the same electrically conductive material.

It is further possible to form electrically conductive bump members for connection to IC pads on a particular conductive circuit layer by a method which comprises the steps of removing the conductive circuit layer portions from portions where the electric connection is to be made to a particular conductive circuit layer among the inner and outer conductive circuit layers maintaining the size that does not affect the conduction, laminating and joining the inner and outer conductive circuit layers one upon another via insulating base members, removing the insulating base members from the portion where the electric connection is to be made to form holes for conduction in which the particular conductive layer portion will be exposed, patterning the outer conductive circuit layer to form a required circuit wiring after a conductive material has been formed in the holes, and forming electrically conductive bump members for connection to IC pads on the interlayer conductive members to protrude from the circuit board. Even in the case of the above bump structure, the steps after the step of forming the holes for conduction can be modified as follows. The solder plating is applied to the holes so that part of the solder plating material electrically connected to the particular conductive layer portion is protruded from the circuit board to form an electrically conductive bump members for connection to IC pads, and to pattern the outer conductive circuit layer to form a required circuit wiring in order to form the interlayer conductive members and the conductive bump members using the same electrically conductive material in the same manner as described above. By combining the above-mentioned methods, it is allowed to provide the same multilayer circuit board with the above electrically conductive bump members of different structures for connection to IC pads.

Concrete processing methods in the aforementioned steps will now be described in detail in the following embodiments.

BEST MODE FOR CARRYING OUT THE INVENTION

Figure 1:
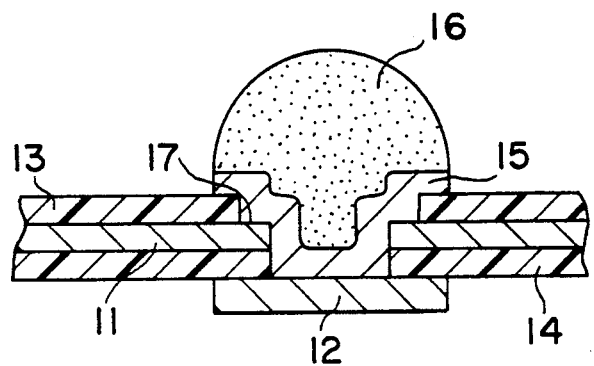
FIGS. 1, 2 and 3 are enlarged sectional views schematically showing the structure of principal part of a multilayer circuit board for mounting ICs equipped with electrically conductive bump members for connection to ICs of a structure that a plurality of conductive layers are connected to each other according to a method of the present invention.
Figure 2:
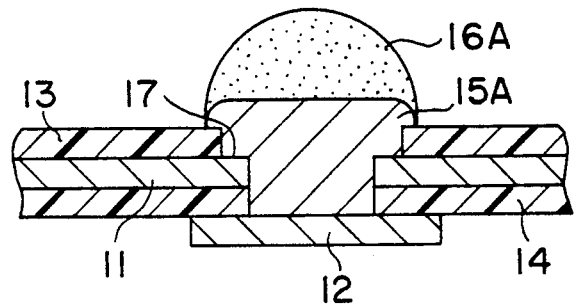
Figure 3:
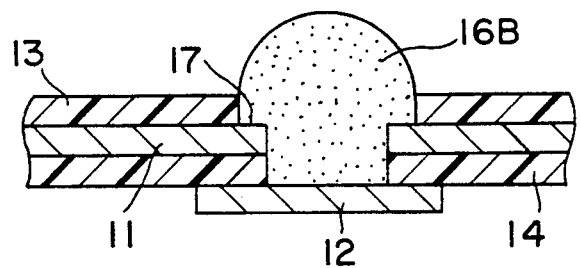

FIGS. 1-3 are enlarged sectional views schematically showing a multilayer circuit board for mounting ICs constituted according to an embodiment of the present invention. In FIG. 1, an inner conductive layer 11 and an outer conductive layer 12 that constitute a circuit board of a double-layer structure are formed by an ordinary patterning treatment applied to foil-like conductive member such as copper foil, so as to form a predetermined circuit wiring pattern. These inner and outer conductive layers 11 and 12 are laminated one upon another via suitable flexible insulating base members 13 and 14 such as polyimide films. Though only one portion is diagramed to simplify the explanation, a stepped hole 17 is formed in a portion where an IC-bearing chip is to be mounted to expose the peripheral edge of the inner conductive layer 11 with the outer conductive layer 12 as the bottom, an electrically conductive bump seat 15 is stepwisely formed by plating means in the hole 17 as interlayer conductive material to connect the inner and outer conductive layers 11 and 12 together, and an electrically conductive bump member 16 for connection to an IC pad having very good mechanical strength and electric characteristics is formed by the solder plating processing and reflow processing so as to protrude semi-spherically beyond the circuit board.

In a structure having upper conductive layers in addition to the inner conductive layer 11, the stepped hole 17 for the step-like conductive bump seat 15 constituting the interlayer conductive structure has a diameter which gradually increases from the lower conductive layers toward the upper conductive layers so that the diameter of the upper portion suitably absorbs a maximum positioning deviation amount of the lower circuit board. The hole 17 of such a stepped form makes it possible to strikingly simplify the processing for laminating and joining the inner and outer circuit boards.

Instead of the above-mentioned stepped conductive bump seat 15 formed by plating means, it is also allowable to form an electrically conductive bump seat 15A as shown in FIG. 2 by filling a silver paste, solder or solder paste in order to constitute thereon a similar semi-spherical conductive bump member 16A. Instead of the conductive bump member of the above-mentioned structure formed via the conductive bump seat 15 or 15A, it is further allowable to constitute a conductive bump member 16B for connection to an IC pad as shown in FIG. 3 by forming the interlayer conductive material and the conductive bump member using the same electrically conductive material in the stepped hole 17 based on the solder plating means and reflow processing.

Figure 4:
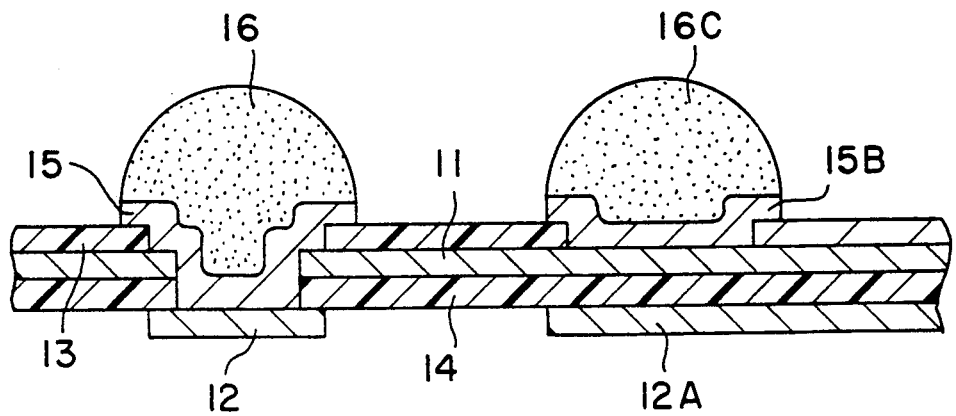
FIGS. 4, 5 and 6 are enlarged sectional views schematically showing the structure of principal part of a multilayer circuit board for mounting ICs according to another method of the present invention by which the same multilayer circuit board is equipped with electrically conductive bump members for connection to IC pads that connect a plurality of conductive layers to each other and with an electrically conductive bump members for connection to IC pads of another structure that makes connection to particular conductive layers.
Figure 5:
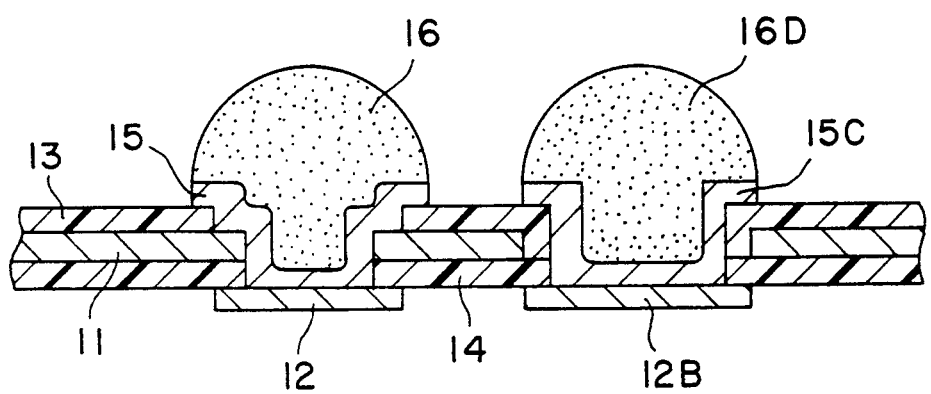
Figure 6:
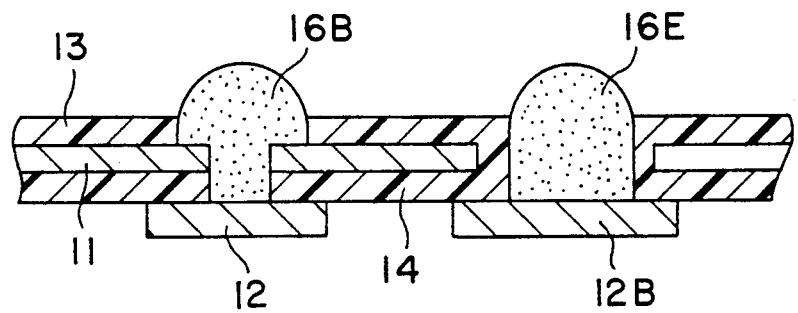

FIGS. 4 through 6 illustrate a multilayer circuit board for mounting ICs in which the electrically conductive bump member 16, 16A or 16B of the interlayer conductive structure and an electrically conductive bump member of another structure connected to a particular conductive layer are formed on the same multilayer circuit board. The structure of FIG. 4 has, in addition to the conductive bump member 16 of FIG. 1, a semi-spherical conductive bump member 16C that is not connected to the outer conductive layer 12A but is connected to the inner conductive layer 11 only via a conductive bump seat 15B. In the case of FIG. 5, there are formed on the same multilayer circuit board the above-mentioned conductive bump member 16 and a semi-spherical conductive bump member 16D that is formed on a conductive bump seat 15C which is not connected to the inner conductive layer 11 but is connected to the outer conductive layer 12B only. In the multilayer circuit board for mounting ICs of FIG. 6, there are formed the conductive bump member 16B of FIG. 3 as well as a conductive bump member 16E that is connected to the outer conductive layer 12B only and that is directly formed using a solder plating material without the conductive bump seat. Though not diagramed, it is allowable as a matter of course to constitute the conductive bump member 16A shown in FIG. 2 and the conductive bump member 16C, 16D or 16E on the same multilayer circuit board in the same manner as described above. The conductive bump members for connection to IC pads of the above-mentioned various structures can be used in combination in relation to the IC bare chips to be mounted and the multilayer circuit board.

Figure 7A:
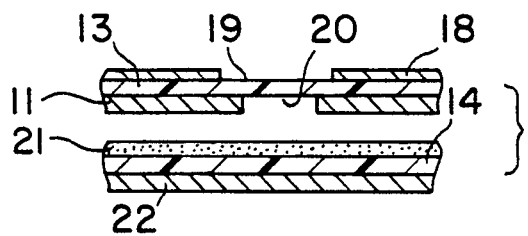
FIGS. 7(a) through 7(g) are diagrams of principal steps of manufacturing the multilayer circuit board for mounting ICs having electrically conductive bump members for connection to IC pads of the structure shown in FIG. 1.

FIGS. 7(a) through 7(g) are diagrams of steps of producing a multilayer circuit board for mounting ICs shown in FIG. 1. Referring to FIG. 7(a), there are prepared a flexible laminated plate clad with copper on both sides thereof, i.e., a flexible insulating base member 13 composed of a polyimide film or a like film having conductive layers 11 and 18 on both sides and a flexible laminated plate clad with copper on one side thereof, i.e., a flexible insulating base member 14 having a conductive layer 22 on one side. A required circuit wiring pattern is formed by etching on the conductive layer 11, the conductive layers 11 and 18 are removed by etching from the corresponding portions where the interlayer conduction is needed, and large and small holes 19 and 20 are formed so that the insulating base member 13 is suitably exposed. In this step, the conductive layer 22 of the laminated plate clad with copper on one side thereof is not subjected to the patterning. The conductive layer 18 is not to form a circuit wiring pattern but works as a mask when a stepped hole is formed as will be described later. Therefore, the conductive layer 18 needs to have a thickness which is smaller than that of other conductive layers.

Here, in addition to a general material obtained by sticking an insulating base member and conductive layers together using an adhesive, the laminated plate clad with copper on both sides thereof may be the one obtained without using the adhesive; i.e., the one obtained by casting a film member to form an insulating base member for a conductive layer such as of a copper foil having a required thickness, or sputtering or vapor-depositing a conductive material on the aforementioned flexible insulating base member to form a conductive layer and, then, thickly forming another conductive layer by plating means on the above conductive layer.

Furthermore, when a multilayer circuit board is constituted having a conductive layer 11 that is an inner layer as well as another inner conductive layer, the hole 20 is formed having a diameter that gradually increases from the lower conductive layers toward the upper conductive layers in a manner that the hole in the lower layer is included in the hole in the upper layer, in order to strikingly solve the problem of misregistration of the boards when the layers are laminated.

Figure 7B:
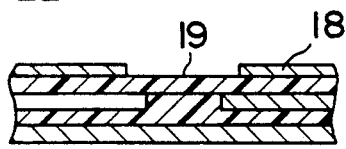
Figure 7C:
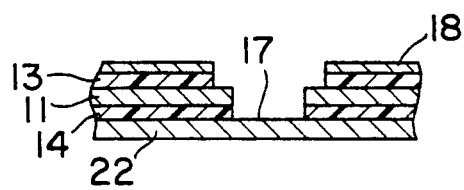

As shown in FIG. 7(b), therefore, the two circuit boards are laminated and joined together using a suitable pre-preg or an adhesive 21, and then the insulating base members exposed through the hole are removed to form a stepped hole 17 as shown in FIG. 7(c). In this case, it is possible to employ a chemical resin etching method using a suitable masking means. Preferably, however, the insulating material is removed by using an excimer laser means. In this case, no complex masking processing is required, and the stepped hole 17 having the above-mentioned relationship in diameter is formed highly efficiently and quickly while utilizing the conductive layers 11 and 18 at the end of the hole as masks.

Figure 7D:
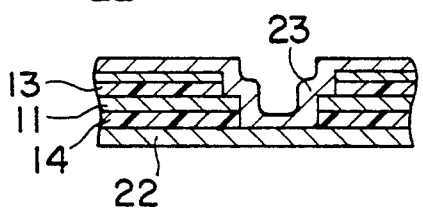

After the stepped hole 17 is formed, the laminate is subjected to the electroless copper-plating processing. As required, furthermore, the electrolytic copper-plating processing is effected to form, as shown in FIG. 7(d), a stepped interlayer conductive member 23 on the inner peripheral surface of the stepped hole 17 formed in the preceding step. Owing to the stepped interlayer conductive member 23, the outer and inner conductive layers 11 and 22 are electrically connected together.

Figure 7E:
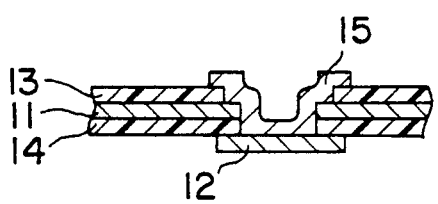
Figure 7F:
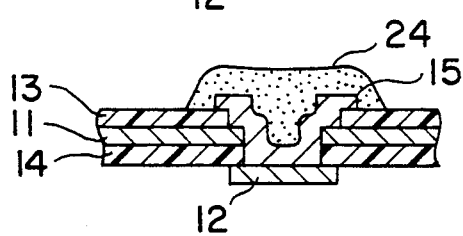
Figure 7G:
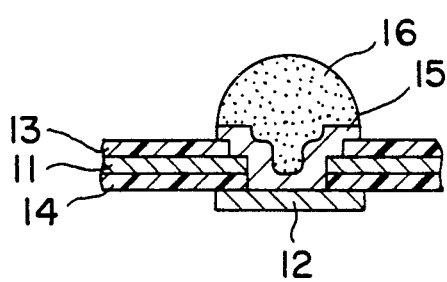

Next, the outer conductive layer 22 is subjected to a required circuit wiring patterning by a known method such as photolithograph and unnecessary portion of the upper conductive layer 18 is removed by etching, and a stepped conductive bump seat 15 is constituted to electrically connect the patterned outer conductive layer 12 to the inner conductive layer 11 as shown in FIG. 7(e). Then, by effecting the solder plating processing 24 and the reflow processing for the bump seat 15 as shown in FIGS. 7(f) and 7(g), there is obtained a multilayer circuit board for mounting ICs having a semi-spherical conductive bump member 16 for connection to an IC pad formed on the stepped conductive bump seat 15 that serves as a stepped interlayer conductive member as shown in FIG. 1, the semi-spherical conductive bump member 16 outwardly protruding from the circuit board.

Figure 8A:
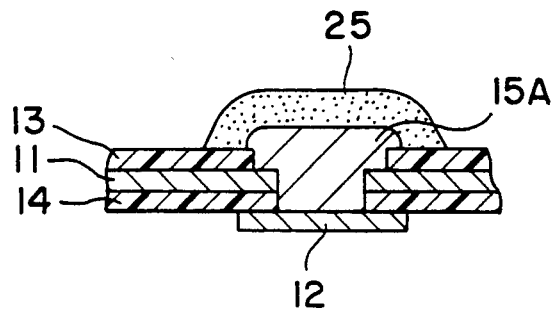
FIGS. 8(a) and 8(b) are diagrams of steps of manufacturing a major portion of the multilayer circuit board for mounting ICs equipped with electrically conductive bump members for connection to IC pads of FIG. 2 in relation to the manufacturing steps of FIG. 3.
Figure 8B:
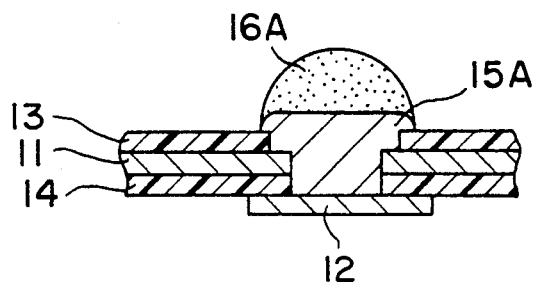

After the step of forming the stepped hole 17 shown in FIG. 7(c) has been finished, a suitable conductive material such as silver paste, solder or solder paste is filled in the stepped hole 17 as shown in FIG. 8(a) in order to form an electrically conductive bump seat 15A of another structure for constituting the interlayer conductive member. Then, the patterning is effected as shown in FIG. 3(5), a solder plating 25 is deposited on the surface of the bump seat 15A, and a reflow processing is effected as shown in FIG. 8(b) to constitute the semi-spherical conductive bump member 16A shown in FIG. 2 of a structure which outwardly protrudes from the bump seat 15A. Here, the outer layer may be patterned prior to forming the conductive bump seat 15A by depositing the conductive material.

Figure 8C:
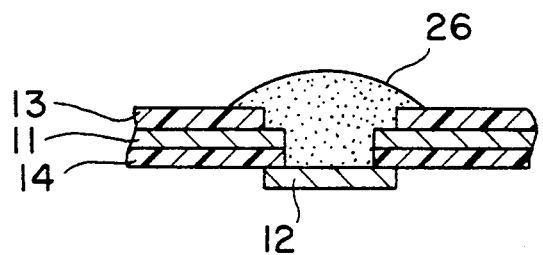
FIGS. 8(c) and 8(d) are diagrams of steps of manufacturing a major portion of the multilayer circuit board for mounting ICs equipped with electrically conductive bump members for connection to IC pads of FIG. 3 in relation to the manufacturing steps of FIG. 7.
Figure 8D:
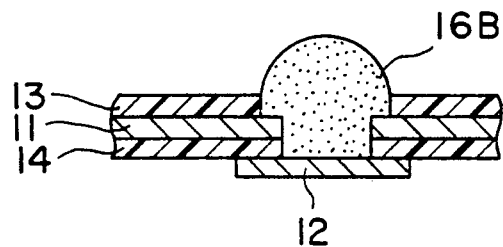

Similarly, furthermore, after the step of forming the stepped hole 17 of FIG. 7(c) is finished, it is allowable to constitute an interlayer conductive member without a bump seat in the step of depositing the solder plating 26 in the stepped hole 17 as shown in FIG. 8(c) and, before or after the above step, the outer layer is patterned in the same manner as described above followed by the reflow processing for the solder plating 26 as shown in FIG. 8(d), in order to constitute the interlayer conductive member and the bump member using the same solder material and, hence, to constitute the semi-spherical conductive bump member 16B corresponding to that of FIG. 3.

Figure 9A:
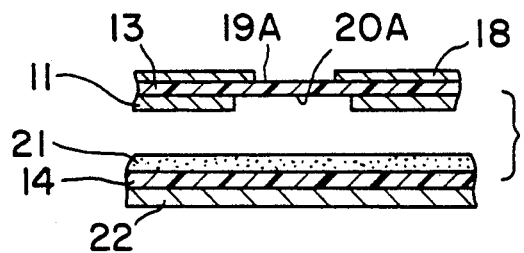
FIGS. 9(a) through 9(g) are diagrams of principal steps of manufacturing a multilayer circuit board for mounting ICs equipped with electrically conductive bump members for connection to IC pads of the structure connected to a particular conductive layer according to another method of the present invention.
Figure 9B:
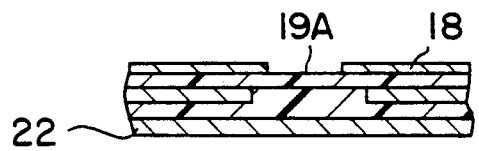
Figure 9C:
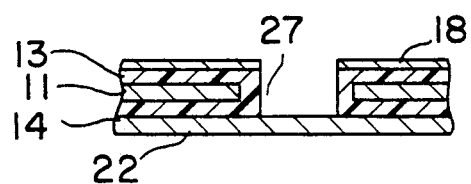

FIGS. 9(a) through 9(g), 10 and 11 illustrate methods of forming the aforementioned semi-spherical conductive bump member in a protruded manner for a particular conductive layer of the multilayer circuit board, the methods of manufacturing thereof resembling that of the steps mentioned above. The same reference numerals as those of FIGS. 7(a) through 7(g) denote the same condstitutional elements. In order to form an electrically conductive bump member 16D that is not connected to the inner conductive layer 11 but is connected to the outer conductive layer 12B as shown in FIG. 5, holes 19A and 20A are formed during the step of patterning a circuit wiring on the inner conductive layer 11 in a manner that the hole 20A formed in the inner conductive layer 11 has a diameter greater than the diameter of the hole 19A formed in the masking conductive layer 18 as shown in FIG. 9(a). Thereafter, the two circuit boards are laminated as shown in FIG. 9(b) in the same manner as the aforementioned step and, then, portions of the insulating base members 13 and 14 under the hole 19A are removed as shown in FIG. 9(c) by excimer laser means to form a hole 27 for conduction in which the outer conductive layer 22 only is exposed. Due to the formation of the hole 20A, the inner circuit wiring pattern conductive layer 11 is not exposed in the hole 27 for conduction but is positioned separate from the hole 27 for conduction via an insulating layer, and is not electrically connected to the electrically conductive bump member.

Figure 9D:
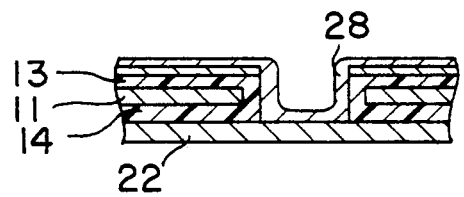
Figure 9E:
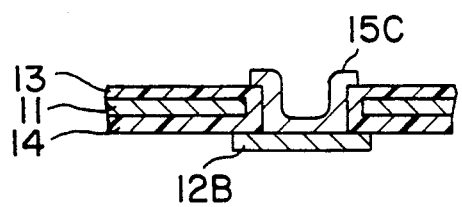
Figure 9F:
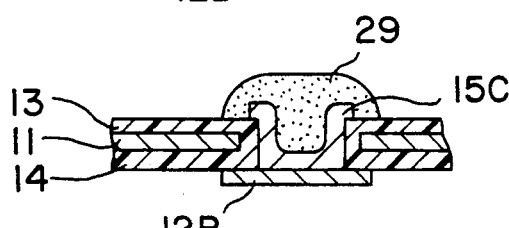
Figure 9G:
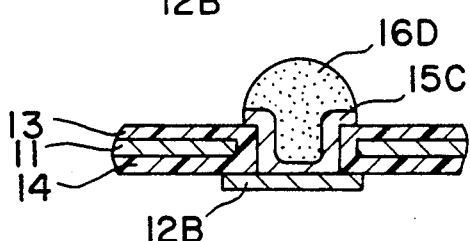

As shown in FIG. 9(d), therefore, a conductive member 28 is formed by effecting the electroless plating and, as required, electrolytic thick plating for the hole 27 for conduction so as to be electrically connected to the outer conductive layer 22 that is exposed in the hole 27 in the same manner as in FIGS. 7(d) to 7(g). Then, the outer conductive layer 22 is patterned to form a circuit wiring and unnecessary portions are removed by etching from the conductive layer 18 for masking, in order to form a conductive layer 12B having a circuit wiring pattern and a conductive bump seat 15C of a recessed shape in cross section as shown in FIG. 9(e). Thereafter, the solder plating 29 is effected for the conductive bump seat 15C as shown in FIG. 9(f) or the reflow processing is effected as shown in FIG. 9(g) before or after the step of forming the bump seat 15C and the conductive layer 12B, in order to form a conductive bump member 16D that is firmly joined to the bump seat 15C and that outwardly protrudes from the circuit board. Here, the preceding stage of the above step is modified in order to constitute the conductive bump member 16C that is not connected to the circuit wiring pattern 12A of the outer layer but is connected to the inner conductive layer 11 only as shown in FIG. 4. That is, at the start of the step of FIG. 9(a), the inner conductive layer 11 is subjected to the predetermined circuit wiring patterning without forming a hole 20A in the inner conductive layer 11, a hole 19A of a predetermined size is formed in the conductive layer 18 for masking, only a portion of the insulating base member appearing in the hole 19A as a result of laminating the two boards is removed by, for example, excimer laser means so that the inner conductive layer 11 is partly exposed. Thereafter, a conductive material is deposited on the hole for conduction, the circuit wiring pattern 12A and the conductive bump seat 15B are formed on the outer conductive layer 22, and the solder plating is deposited on the bump seat 15B followed by the reflow processing in the same manner as the aforementioned steps, in order to obtain a conductive bump member 16C that is connected to the inner conductive layer 11 only as shown in FIG. 4.

Figure 11:
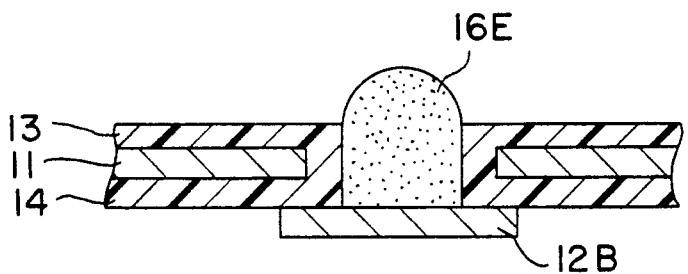
FIG. 11 is an enlarged sectional view schematically showing the structure of a multilayer circuit board for mounting ICs in which the electrically conductive bump members for connection to IC pads are directly formed of solder plated material without conductive bump seats by modifying the manufacturing steps of FIG. 9.
Figure 12:
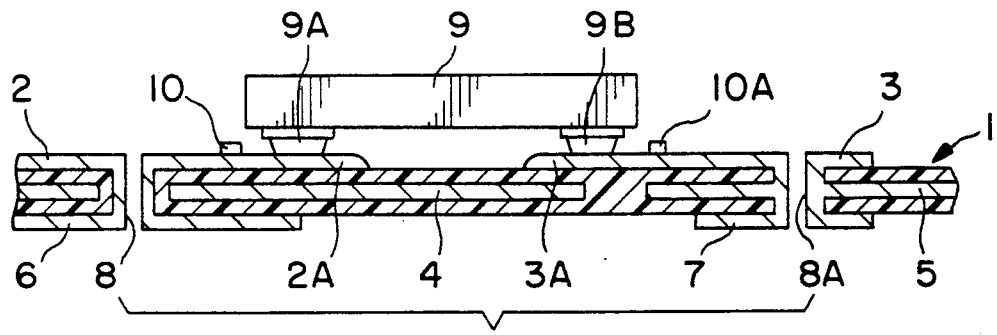
FIG. 12 is an enlarged sectional view schematically showing the structure of the multilayer circuit board for mounting ICs having a conventional structure.

Instead of forming the conductive material 28 by the non-electrolytic plating shown in FIG. 9(d), it is also allowable as shown in FIG. 9(c) to put the aforementioned conductive material in the hole 27 for conduction to form a conductive bump seat 15D as shown in FIG. 9(g) followed by the solder plating and reflow processing for the bump seat 15D, thereby to obtain a semi-spherical conductive bump member 16F that is connected to the outer conductive layer 12B only. Moreover, by modifying the step of FIG. 9(c) to effect the solder plating for the hole 27 for conduction and by employing the subsequent steps, it is allowed to constitute another semi-spherical conductive bump member 16E that is connected to the outer conductive layer 12B only as shown in FIG. 11. This can be applied to the conductive bump member 16E for connection to an IC pad mentioned already with reference to FIG. 2(3).

Figure 10:
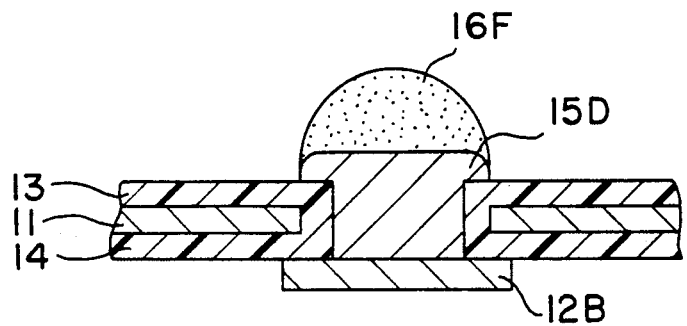
FIG. 10 is an enlarged sectional view schematically showing the structure of a multilayer circuit board for mounting ICs equipped with electrically conductive bump members for connection to IC pads having electrically conductive bump seats formed of filled conductive material by modifying the manufacturing steps of FIG. 9.

It is further allowable to use the conductive bump member formed via the filling conductive bump seat or the conductive bump member formed by the solder plating means only as shown in FIGS. 10 and 8 as the conductive bump material that is shown in FIG. 4 and that is connected to the inner conductive layer 11 only. It is further possible to realize the structure of conductive bump members for connection to IC pads that are not connected to one or more conductive layers but that connects a plurality of other conductive layers together in a multilayer circuit board equipped with three or more layers by adopting the method of forming conductive bump members of the structure to connect a plurality of conductive layers together mentioned in conjunction with FIGS. 7 and 8 and by adopting the method of forming conductive bump members of the structure which are connected to particular conductive layers mentioned in conjunction with FIGS. 9 to 11.

As described above, the conductive bump members constituted in a variety of structures can be most appropriately selected or used in combination depending upon the structure of the multilayer circuit board in relation to the structure or function of the IC-bearing chips mounted thereon. Moreover, the above-mentioned multilayer circuit board structure can be adapted to a hybrid structure consisting of both flexible and rigid circuit boards in addition to the flexible multilayer circuit board.

Industrial Applicability

An electrically conductive bump member for connection to an IC pad that works as a bump for mounting an IC bare chip, is buried in an insulating base member and has a tip that outwardly potrudes in a semi-spherical shape. Therefore, the electrically conductive bump member for connection to an IC pad is featured by excellent mechanical strength and electric properties as well as high precision in position.

A hole for conduction must be formed in an insulating base member to provide a conductive bump member for connection to an IC pad. This hole can be formed highly efficiently and quickly by excimer laser means or like means while greatly reducing the number of steps without affected by the development of smear involved in the conventional boring method which uses a drill, therefore, it is possible to forming even fine holes.

The electrically conductive bump member for connection to an IC pad formed according to the method of the present invention can be cheaply formed in a semispherically protruded manner using a solder plating material to facilitate the connection to an IC bare chip.

The conductive bump member of the structure for connecting a plurality of conductive layers together in a multilayer circuit board and the conductive bump member of another structure that can be connected to particular conductive layers, are used alone or in combination, making it possible to design conductive bump members most favorable to the specifications with a high degree of freedom in correspondence with the structure of the multilayer circuit board in relation to the structure of an IC bare chip or the function thereof mounted thereon.

As described above, the conductive bump members having various structures can be arranged on the multilayer circuti board in positions corresponding to the pads of the IC bare chip, making it possible to increase the wiring density of the multilayer circuit board and, hence, to realize the multilayer circuit board of this type in a compact size.

It is possible to provide an optimum multilayer circuit board for mounting ICs where area-bonding, i.e., surface mounting which is advantageious for mounting the modern IC bare chips can be carried out.

We claim:

1. In a multilayer circuit board defined by a plurality of conductive layers in which required circuit wiring patterns have been formed, successive conductive layers of the multilayer board being separated by insulating base members and at least a first surface of the multilayer circuit board being overlaid by an insulating member which defines a first side of said board, the improvement comprising:

at least a first stepped hole located at a position on said multilayer circuit board where at least some of said wiring patterns are to be connected to each other, said stepped hole extending inwardly from said first side of said board and exposing surface portions of plural conductive layers which include the wiring patterns to be interconnected, said hole terminating at the surface of a first conductive layer to which a connection is to be made and being enlarged in stepwise fashion at each conductive layer to be interconnected proceeding toward said first side of said multilayer circuit board;

an interlayer conductive member provided in said stepped hole and electrically connected to the exposed portions of said plural conductive layers; and an electrically conductive IC pad contact member provided on said interlayer conductive member and electrically connected thereto, said contact member protruding downwardly from said first side of said multilayer circuit board.

2. The multilayer circuit board of claim 1 wherein said interlayer conductive member defines a concave seat for receiving said contact member.

3. The multilayer circuit board of claim 2 wherein said seat defining member is comprised of a plating which extends from said first conductive layer to said first side of said multilayer circuit board, said plating electrically interconnecting the conductive layers that are exposed in said stepped hole.

4. The multilayer circuit board on claim 2 wherein said seat defining member comprises an electrically conductive material which fills said stepped hole.

5. The multilayer circuit board of claim 1 wherein said contact member is comprised of a solder material which can be caused to reflow.

6. The multilayer circuit board of claim 1 wherein said interlayer conductive member and said contact member are comprised of the same electrically conductive material.

7. The multilayer circuit board of claim 6 wherein said conductive material is a solder material that can be caused to reflow.

8. The multilayer circuit board of claim 1 wherein the portion of said contact member which protrudes beyond the surface of said multilayer circuit board has a semi-spherical configuration.

9. In a multilayer circuit board constituted by laminating a plurality of conductive circuit layers on which required circuit wiring patterns are formed with insulating base members, adjacent conductive layers being separated by an insulating base member and at least a first side of said multilayer circuit board being defined by an insulating base member, at least a portion of said multilayer circuit board being configured for the mounting of an IC thereon, said portion of said circuit board comprising holes, said holes each extending from a preselected conductive circuit layer among said plural conductive circuit layers to said first side of said multilayer circuit board through at least a second conductive layer, surface regions of the preselected layer and a second conductive layer which is intermediate the preselected layer and said first side being exposed at a circumference of said holes, a conductive member positioned in each of said holes and electrically connected to said exposed surface regions of said conductive circuit layers, and electrically conductive bump members for connection to a pad on an IC, said bump members being provided on said conductive members, said bump members protruding outwardly from said first side of said circuit board from said conductive members.

10. The multilayer circuit board of claim 9, wherein said conductive members comprise seat defining members that are electrically connected to said conductive bump members.

11. The multilayer circuit board of claim 10, wherein said seat defining members are comprised of plating members connected to said preselected circuit layers that are exposed in the bottoms of said holes.

12. The multilayer circuit board of claim 10, wherein said seat defining members each comprise an electrically conductive material with which said holes are filled and which is connected to said preselected conductive circuit layer.

13. The multilayer circuit board of claim 9, wherein said conductive bump members are made of a solder material that can be caused to reflow.

14. The multilayer circuit board of claim 9, wherein said conductive members and said conductive bump members are comprised of the same electrically conductive material.

15. The multilayer circuit board of claim 14, wherein said conductive material is a solder material that can be caused to reflow.

16. The multilayer circuit board of claim 9, wherein the portion of each of said conductive bump members which protrudes from said circuit board has a semi-spherical shape.

* * * * *